(12) United States Patent
Motwani et al.

(10) Patent No.: US 10,621,035 B2
(45) Date of Patent: Apr. 14, 2020

(54) TECHNIQUES FOR CORRECTING DATA ERRORS IN MEMORY DEVICES

(71) Applicant: Intel Corporation, Santa Clara, CA (US)

(72) Inventors: Ravi H. Motwani, Fremont, CA (US); Santhosh K. Vanaparthy, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 174 days.

(21) Appl. No.: 15/787,644

(22) Filed: Oct. 18, 2017

(65) Prior Publication Data

US 2019/0114224 A1    Apr. 18, 2019

(51) Int. Cl.
| | |
|---|---|
| *G06F 11/10* | (2006.01) |
| *G11C 29/52* | (2006.01) |
| *H03M 13/11* | (2006.01) |
| *H03M 13/00* | (2006.01) |
| *H03M 13/37* | (2006.01) |
| *G06F 11/22* | (2006.01) |
| *G11C 13/00* | (2006.01) |

(52) U.S. Cl.
CPC ...... *G06F 11/1068* (2013.01); *G06F 11/1048* (2013.01); *G11C 29/52* (2013.01); *H03M 13/1108* (2013.01); *H03M 13/1117* (2013.01); *H03M 13/3715* (2013.01); *H03M 13/616* (2013.01); *G11C 13/0004* (2013.01); *H03M 13/6362* (2013.01)

(58) Field of Classification Search
CPC .. G06F 11/1068; G06F 11/1048; G11C 29/52; G11C 13/0004; H03M 13/1108; H03M 13/616; H03M 13/3715; H03M 13/1117; H03M 13/6362
See application file for complete search history.

(56) References Cited

U.S. PATENT DOCUMENTS

| | | | | |
|---|---|---|---|---|
| 5,563,894 | A * | 10/1996 | Fujiwara | G06F 11/1028 714/753 |
| 5,740,188 | A * | 4/1998 | Olarig | G06F 11/1008 714/763 |
| 7,600,174 | B2 * | 10/2009 | Kyung | H03M 13/1134 714/758 |
| 8,266,493 | B1 * | 9/2012 | Abbaszadeh | H03M 13/1134 375/240.24 |
| 9,495,518 | B2 | 11/2016 | Kim et al. | |
| 9,633,744 | B2 | 4/2017 | Kavalipurapu et al. | |

(Continued)

OTHER PUBLICATIONS

Palanki et al., Iterartive Decoding of Multiple-Step Majority Logic Decodable Codes, IEEE Transactions on communications, vol. 55, issue: 6, pertinent pp. 1099-1102 (Year: 2007).*

(Continued)

*Primary Examiner* — Cynthia Britt
*Assistant Examiner* — Dipakkumar B Gandhi
(74) *Attorney, Agent, or Firm* — Thorpe North & Western, LLP

(57) ABSTRACT

Technology for correcting memory read errors including a preprocessing majority logic decode based on a plurality of identity structures of a parity check matrix, before ECC decoding using the parity check matrix, to estimate a set of erased or punctured bits of a codeword.

30 Claims, 10 Drawing Sheets

(56) References Cited

U.S. PATENT DOCUMENTS

| | | | | |
|---|---|---|---|---|
| 2007/0086239 | A1* | 4/2007 | Litsyn | G06F 11/1068 365/185.03 |
| 2008/0034270 | A1* | 2/2008 | Onishi | G06F 11/1048 714/758 |
| 2009/0319863 | A1* | 12/2009 | Shirai | G06F 11/1068 714/755 |
| 2011/0252283 | A1* | 10/2011 | Mokhlesi | G06F 11/1068 714/719 |
| 2012/0290901 | A1* | 11/2012 | Kong | G06F 1/3225 714/781 |
| 2014/0164874 | A1* | 6/2014 | Franceschini | G06F 11/10 714/764 |
| 2017/0084347 | A1 | 3/2017 | Kavalipurapu et al. | |
| 2017/0242748 | A1 | 8/2017 | Lin | |

OTHER PUBLICATIONS

Zhao et al., A Low Complexity Decoding Algorithm for Majority-Logic Decodable Nonbinary LDPC Codes, IEEE Communications Letters, vol. 14, Issue: 11, pertinent pp. 1062-1064 (Year: 2010).*

Cai et al.; "Threshold Voltage Distribution in MLC NAND Flash Memory: Characterization, Analysis, and Modeling." Proceedings of the Conference on Design, Automation and Test in Europe; Mar. 18-22, 2013; pp. 1285-1290.

Gunnam.; "LDPC Decoding: VLSI Architectures and Implementations. Module 2: VLSI Architectures and Implementations." Flash Memory Summit; 2012; 51 Pages.

Haratsch.; "NAND Flash Media Management Algorithms." Seagate; Flash Memory Summit; Aug. 7, 2016; 23 Pages.

Hawes.; "How Micron FortisFlash Technology Improves Performance and Endurance."A Micron Technical Marketing Brief; Micron; 2015; 4 Pages.

Islam et al.; "Optimized Min-Sum Decoding Algorithm for Low Density Parity Cheek Codes." International Journal of Advanced Computer Science and Applications; 2011; vol. 2, Issue 12; pp. 168-174.

Johnson.; "Introducing Low-Density Parity-Check Codes." ACoRN Spring School; May 2010; 83 Pages.

Kim et al.; "Low-Energy Error Correction of NAND Flash Memory Through Soft-Decision Decoding." EURASIP Journal on Advances in Signal Processing; Springer; Sep. 2012; vol. 195; 12 Pages.

Micron.; "NAND Flash 101: An Introduction to NAND Flash and How to Design It in to Your Next Product." Technical Note; TN-29-19: NAND Flash 101 Introduction; 2006; 27 Pages.

Mossel.; "Lecture 15, Bit Flipping Algorithm and the Gallager Bound." STAT 206A: Gibbs Measures; Oct. 17, 2006; 4 Pages.

Motwani et al.; "Low Density Parity Check (LDPC) Codes and the Need for Stronger ECC." Intel; Aug. 2011; 18 Pages.

Novotny et al.; "NAND Flash Memory Organization and Operations." J. Inform Tech Softw Eng; 2015; vol. 5, Issue 1; 8 Pages.

Regulapati.; "Error Correction Codes in NAND Flash Memory." Dec. 2015; 66 Pages.

* cited by examiner

| | C1 | C2 | C3 | C4 | C5 | C6 | C7 | C8 | C9 | C10 |
|---|---|---|---|---|---|---|---|---|---|---|
| R1 | 1 | 0 | 0 | 0 | 0 | 0 | 1 | 1 | 0 | 0 |
| R2 | 1 | 1 | 0 | 0 | 0 | 0 | 0 | 0 | 1 | 0 |
| R3 | 0 | 1 | 1 | 0 | 0 | 0 | 0 | 0 | 0 | 1 |
| R4 | 0 | 1 | 1 | 1 | 0 | 0 | 0 | 1 | 0 | 0 |
| R5 | 0 | 0 | 1 | 1 | 1 | 0 | 0 | 0 | 1 | 0 |
| R6 | 0 | 0 | 0 | 0 | 1 | 1 | 0 | 0 | 0 | 1 |
| R7 | 0 | 0 | 0 | 0 | 1 | 1 | 0 | 1 | 0 | 0 |
| R8 | 0 | 0 | 0 | 0 | 0 | 1 | 1 | 0 | 1 | 0 |
| R9 | 0 | 0 | 0 | 1 | 0 | 0 | 1 | 0 | 0 | 1 |

|   |   |   |   |   |   |   |   |   |
|---|---|---|---|---|---|---|---|---|
| 1 | 0 | 0 | 0 | 0 | 0 | 0 | 0 | ⎫ |
| 0 | 1 | 0 | 0 | 0 | 0 | 0 | 0 | ⎪ |
| 0 | 0 | 1 | 0 | 0 | 0 | 0 | 0 | ⎪ |
| 0 | 0 | 0 | 1 | 0 | 0 | 0 | 0 | ⎬ 1010 |
| 0 | 0 | 0 | 0 | 1 | 0 | 0 | 0 | ⎪ |
| 0 | 0 | 0 | 0 | 0 | 1 | 0 | 0 | ⎪ |
| 0 | 0 | 0 | 0 | 0 | 0 | 1 | 0 | ⎪ |
| 0 | 0 | 0 | 0 | 0 | 0 | 0 | 1 | ⎭ |
| 1 | 0 | 0 | 0 | 0 | 0 | 0 | 0 | ⎫ |
| 0 | 1 | 0 | 0 | 0 | 0 | 0 | 0 | ⎪ |
| 0 | 0 | 1 | 0 | 0 | 0 | 0 | 0 | ⎪ |
| 0 | 0 | 0 | 1 | 0 | 0 | 0 | 0 | ⎬ 1020 |
| 0 | 0 | 0 | 0 | 1 | 0 | 0 | 0 | ⎪ |
| 0 | 0 | 0 | 0 | 0 | 1 | 0 | 0 | ⎪ |
| 0 | 0 | 0 | 0 | 0 | 0 | 1 | 0 | ⎪ |
| 0 | 0 | 0 | 0 | 0 | 0 | 0 | 1 | ⎭ |
| 1 | 0 | 0 | 1 | 0 | 0 | 0 | 1 | ⎫ |
| 1 | 1 | 0 | 0 | 1 | 0 | 0 | 0 | ⎪ |
| 1 | 1 | 1 | 0 | 0 | 0 | 0 | 0 | ⎪ |
| 1 | 1 | 1 | 0 | 0 | 0 | 0 | 0 | ⎪ |
| 0 | 1 | 1 | 1 | 0 | 0 | 0 | 0 | ⎬ 1030 |
| 0 | 0 | 1 | 1 | 1 | 0 | 0 | 0 | ⎪ |
| 0 | 0 | 0 | 1 | 1 | 1 | 1 | 0 | ⎪ |
| 0 | 0 | 0 | 0 | 1 | 1 | 1 | 1 | ⎪ |
| 0 | 0 | 0 | 0 | 0 | 1 | 1 | 1 | ⎪ |
| 0 | 0 | 0 | 0 | 0 | 1 | 1 | 1 | ⎭ |

FIG. 10

TECHNIQUES FOR CORRECTING DATA ERRORS IN MEMORY DEVICES

BACKGROUND

Computing device readable media, such as floating gate memory, Phase Change Memory (PCM), SSD based on floating gate memory or PCM, and the like, utilize error correction algorithms to detect and correct errors that occur during operation. Errors can be caused by a number of sources, such as random noise, cell-to-cell interference, read or write disturb, programming error, retention errors, charge leakage and trapping generation. As memory devices continue to be scaled and/or the number of bits stored per cell increases, the error rate tends to increase. Accordingly, there is a continuing need for improved error correction algorithms for use with memory devices.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein:

FIG. 10 is a diagram illustrating a LDPC parity check matrix in accordance with another example.

DESCRIPTION OF EMBODIMENTS

Figure 1:
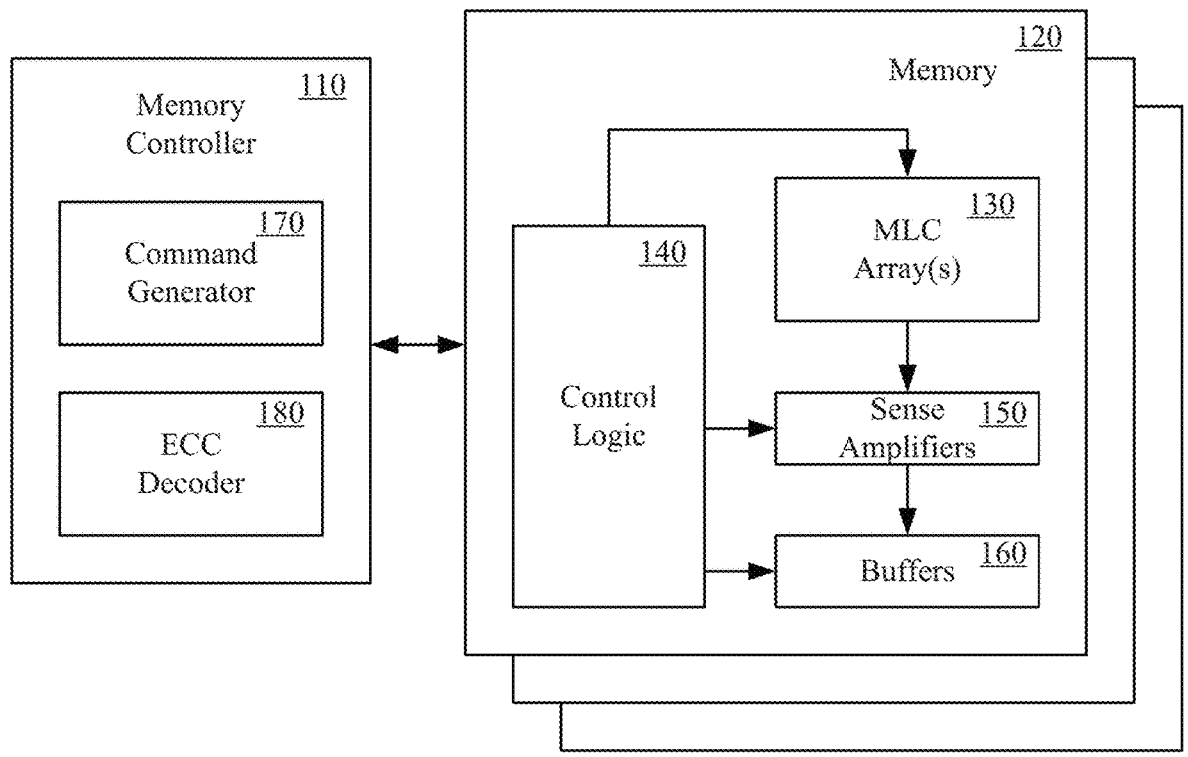
FIG. 1 is a diagram illustrating one or more memory devices and a memory controller in accordance with an example.

Before embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to convey a thorough understanding of various embodiments. One skilled in the relevant art will recognize, however, that such detailed embodiments do not limit the overall inventive concepts articulated herein, but are merely representative thereof.

Reference throughout this specification to "an example" means that a particular feature, structure, or characteristic described in connection with the example is included in at least one embodiment. Thus, appearances of the phrases "in an example" or "in an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and examples can be referred to herein along with alternatives for the various components thereof. It is understood that such embodiments, examples, and alternatives are not to be construed as de facto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open-ended term in this written description, like "comprising" or "including," it is understood that direct support should be afforded also to "consisting essentially of" language as well as "consisting of language as if" stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device, which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases, depend on the specific context. However, generally speaking, the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood, that such a range format is used merely for convenience and brevity, and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

As used herein, the term "circuitry" can refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some aspects, the circuitry can be implemented in, or functions associated with the circuitry can be implemented by, one or more software or firmware modules. In some aspects, circuitry can include logic, at least partially operable in hardware.

Various techniques, or certain aspects or portions thereof, may take the form of program code (i.e., instructions) embodied in tangible media, such as compact disc-read-only memory (CD-ROMs), hard drives, transitory or non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a random-access memory (RAM), erasable programmable read only memory (EPROM), flash drive, optical drive, magnetic hard drive, solid state drive, or other medium for storing electronic data. One or more programs that may implement or utilize the various techniques described herein may use an application programming interface (API), reusable controls, and the like. Such programs may be implemented in a high level procedural or object-oriented programming language to communicate with a computer system. However, the program(s) may be implemented in assembly or machine language, if desired. In any case, the language may be a compiled or interpreted language, and combined with hardware implementations.

Non-volatile memory (NVM) is a persistent storage medium, or in other words, a storage medium that does not require power to maintain the state of data stored therein. Nonlimiting examples of non-volatile memory can include planar or three-dimensional (3D) NAND flash memory, including single or multi-threshold-level NAND flash memory, NOR flash memory, single or multi-level Phase Change Memory (PCM), such as chalcogenide glass PCM, planar or 3D PCM, cross-point array memory, including 3D cross-point memory, non-volatile dual in-line memory module (NVDIMM)-based memory, such as flash-based (NVDIMM-F) memory, flash/DRAM-based (NVDIMM-N) memory, persistent memory-based (NVDIMM-P) memory, 3D cross-point-based NVDIMM memory, resistive RAM (ReRAM), including metal-oxide- or oxygen vacancy-based ReRAM, such as $HfO_2$—, $Hf/HfO_x$—, $Ti/HfO_2$—, $TiO_x$—, and $TaO_x$-based ReRAM, filament-based ReRAM, such as $Ag/GeS_2$—, $ZrTe/Al_2O_3$—, and Ag-based ReRAM, programmable metallization cell (PMC) memory, such as conductive-bridging RAM (CBRAM), silicon-oxide-nitride-oxide-silicon (SONOS) memory, ferroelectric RAM (FeRAM), ferroelectric transistor RAM (Fe-TRAM), anti-ferroelectric memory, polymer memory (e.g., ferroelectric polymer memory), magnetoresistive RAM (MRAM), write-in-place non-volatile MRAM (NVMRAM), spin-transfer torque (STT) memory, spin-orbit torque (SOT) memory, nanowire memory, electrically erasable programmable read-only memory (EEPROM), nanotube RAM (NRAM), other memristor- and thyristor-based memory, spintronic magnetic junction-based memory, magnetic tunneling junction (MTJ)-based memory, domain wall (DW)-based memory, and the like, including combinations thereof. The term "memory device" can refer to the die itself and/or to a packaged memory product. Non-volatile memory can be byte or block addressable. In some examples, non-volatile memory can comply with one or more standards promulgated by the Joint Electron Device Engineering Council (JEDEC), such as JESD21-C, JESD218, JESD219, JESD220-1, JESD223B, JESD223-1, or other suitable standard (the JEDEC standards cited herein are available at www.jedec.org). In one specific example, non-volatile memory can be PCM storage cells and a stackable cross-gridded data access array, such as, for example 3D cross-point memory.

As used herein, the term "processor" can include general purpose processors, specialized processors such as central processing units (CPUs), graphics processing units (GPUs), digital signal processors (DSPs), microcontrollers (MCUs), embedded controller (ECs), field programmable gate arrays (FPGAs), or other types of specialized processors, as well as base band processors used in transceivers to send, receive, and process wireless communications.

It should be understood that many of the functional units described in this specification may have been labeled as modules, in order to more particularly emphasize their implementation independence. For example, a module may be implemented as a hardware circuit comprising custom very-large-scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module may not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. The modules may be passive or active, including agents operable to perform desired functions.

Example Embodiments

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

Error correction codes (ECC) are an integral part of conventional memory devices. ECC techniques can be used to correct bit errors typically introduced when reading or writing to memory. ECC encoding techniques are used to add redundancy to the data bits to form a codeword for storage in the memory devices. ECC decoding techniques use the codeword to detect and correct errors therein. However, other mechanism may result in the loss of one or more set of bits. For example, the memory device may include a plurality of memory arrays fabricated on respective integrated circuit (IC) chips, wherein codewords are stored across the plurality of memory array IC chips. When a memory array IC chip fails, a subset of bits of the codeword may be lost, also referred to as an erasure. In another example, an ECC code may be designed to support multiple data and parity sizes. In such a case, a jumbo code can be designed with the largest data and parity sizes, among all the supported configurations. The jumbo code is shortened by not storing a subset of the bits when storing as the codeword, which is also referred to as a puncture. When decoding a codeword with punctured or erased bits, the decoder may set the erased or punctured subset of bits to an erased state and attempt to correct any read and write errors along with erase and puncture errors.

In one example, a system configured to correct errors includes a memory device and a memory controller. The memory controller can receive codeword information from the memory device. The memory controller can majority logic decode a subset of bits of the codeword information based on a plurality of identity structures of a parity check matrix to generate revised codeword information when a subset of bits of the codeword information is erased or punctured. A parity check equation in the parity check matrix can be used as an identity structure when the given parity check equation includes a single one of the erased or punctured bits as an operand.

The memory controller can decode the revised codeword information using an Error Correcting Code (ECC) algorithm and the parity check matrix to generate decoded data. When a subset of bits of the codeword information is not erased or punctured, the memory controller can decode the received codeword information using the ECC algorithm and the parity check matrix to generate the decoded data.

Majority logic decoding the subset of bits of the codeword information can include estimating a plurality of values for each of a subset of bits of the codeword information based on the plurality of identity structures. The majority logic algorithm can be used to select the majority value for each bit from the plurality of values of the subset of bits of the codeword information to generate the revised codeword information.

The ECC algorithm can be a Low-Density Parity Code (LDPC) algorithm that, in one example, is performed in two stages. In a first stage, the revised codeword information can be decoded using a Bit-Flipping Decode (BFD) algorithm, for example, to generate the decoded data. However, if the BFD algorithm cannot correct one or more errors in the codeword information, the revised codeword information can be further decoded in the second stage, using a Min-Sum algorithm, for example, to generate the decoded data. While the Min-Sum algorithm has a large correction strength, the Min-Sum algorithm may not be able to meet latency needs of a given system. The BFD algorithm is designed, however, such that approximately 99% or more of codewords for the Raw Bit Error Rate (RBER) specification are decoded successfully, and less than approximately 1% of codewords invoke the Min-Sum algorithm. The use of a preprocessing majority logic decode algorithm to estimate punctured or erased subset of bits where a second stage algorithm is needed can improve the performance of the ECC algorithm. Furthermore, the majority logic decode algorithm uses a plurality of identity structures from the parity check matrix used by the LDPC algorithms, and therefore does not incur additional encoding processes and/or addition data for use in the decoding process. Instead, the same parity check matrix is used for both majority logic decode and LDPC decode operations.

FIG. 1 is a diagram illustrating one or more memory devices and a memory controller in accordance with an example. The memory controller 110 can control read, write and erase operations for the one or more memory devices 120. The memory 120 can include one or more memory cell arrays 130, control logic 140, sense amplifiers 150, and buffers 160. The memory 120 typically includes other sub-circuits that are not necessary for an understanding of the present technology, and therefore are not discussed herein. The memory controller 110 can include a command generator 170 and an Error Correcting Code (ECC) encoder/decoder 180. The memory controller 110 also typically includes other sub-circuits that are not necessary for an understanding of the present technology and therefore are not discussed herein.

The command generator 170 can receive read and write requests from a host device or system. In response to the received write requests, the command generator 170 can generate corresponding write commands, and if applicable corresponding erase commands. Along with the write commands, the ECC encoder/decoder 180 can encode user data with an error correcting code as a codeword that is stored in the memory 120. In response to read requests, the command generator 170 can generate corresponding read commands for controlling operation of the memory 120. The ECC encoder/decoder 180 receives codeword information from the memory 120 in response to the read commands, and decodes the user data from the received codeword information.

In one aspect, the memory cell arrays 130 can be arranged in a horizontal string. In an exemplary instance, the horizontal string may include twenty (20) memory cell arrays. The memory cells array can be organized into blocks, which is the smallest unit that can be erased, and each block can include a number of pages. Read and write operations can be performed one page at a time. Each page can store one or more codewords, wherein a codeword includes user data and ECC code data. Bit-Lines (BL) can be connected to the ends of vertical strings of cells, and the Word-Lines (WL) can be connected horizontally across strings of the cells.

Figure 2:
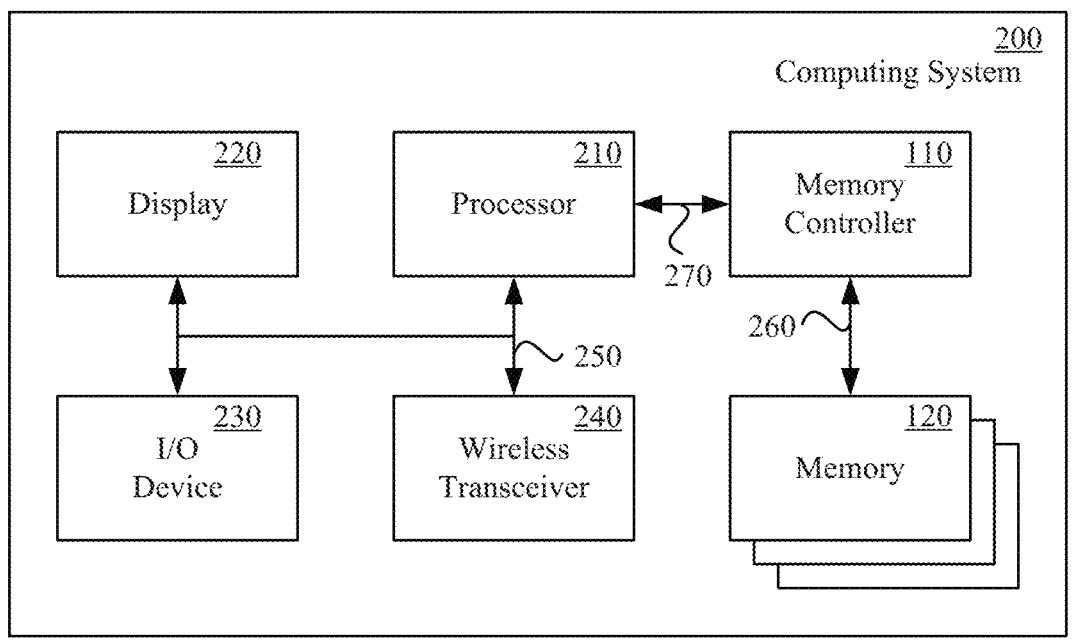
FIG. 2 is a diagram illustrating a computing system including a memory device and memory controller in accordance with an example.

FIG. 2 is a diagram illustrating a computing system including a memory device and memory controller in accordance with an example. The computing system 200 can include a processor 210, a memory controller 110, one or more memory devices 120, and one or more input/output devices 220-240 that can be communicatively coupled together by one or more communication interfaces 250-270. The computing system 200 can include other sub-circuits that are not necessary for an understanding of the present technology and therefore are not discussed herein.

The computing system 200 can, for example, be a cellular telephone, smart phone, e-reader, tablet personal computer (PC), network, laptop PC, gaming console, desktop PC, workstation, server computer, or other similar computing system or device. The memory controller 110 can be implemented as a separate sub-circuit, or be integral to one or more other sub-circuits of the computing system 200. The memory 120 and memory controller 110 can be configured to correct errors in read data as further described herein.

Figure 3:
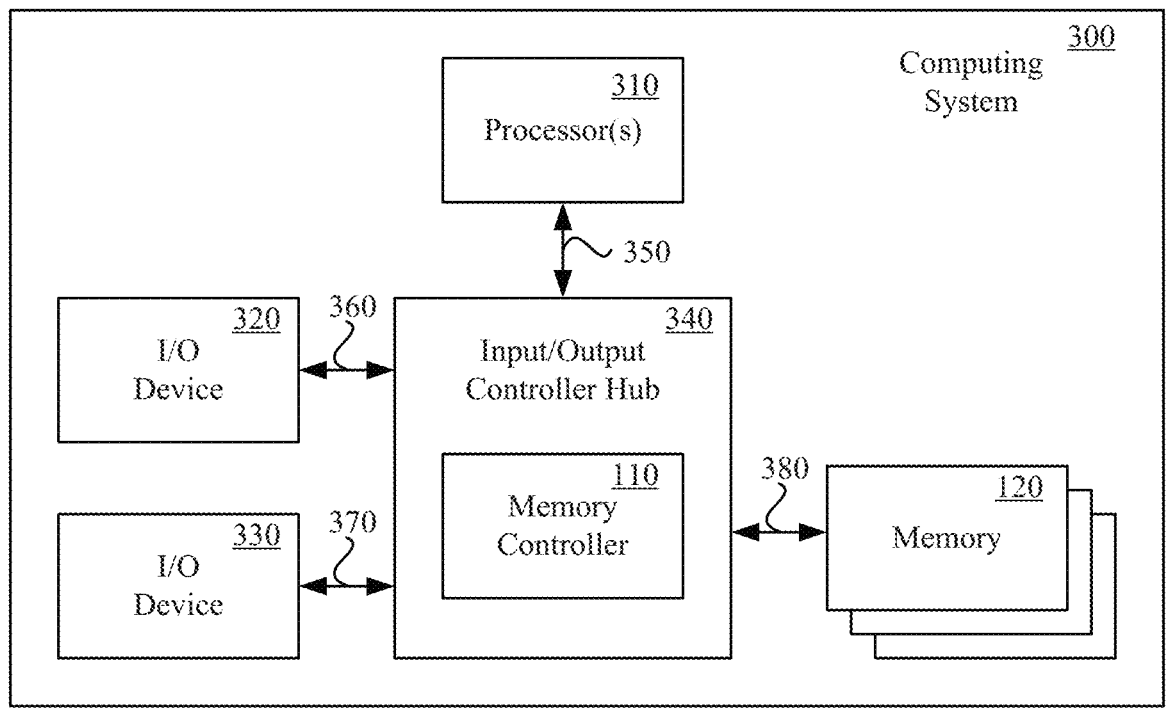
FIG. 3 is a diagram illustrating a computing system including a memory device and memory controller in accordance with another example.

FIG. 3 is a diagram illustrating a computing system including a memory device and memory controller in accordance with another example. The computing system 300 can include one or more processors 310, one or more memory controllers 110, one or more memory devices 120, and one or more input/output devices 320-330 that can be communicatively coupled together by one or more input/output controller hubs 340, one or more buses 350-380 and/or other similar communication interfaces. The computing system 300 can include other sub-circuits that are not necessary for an understanding of the present technology and therefore are not discussed herein.

Again, the computing system 300 can, for example, be a cellular telephone, smart phone, e-reader, tablet personal computer (PC), netbook, laptop PC, gaming console, desktop PC, workstation, server computer, or other similar computing device. The memory controller 110 can be integral to one or more other sub-circuits such as the input/output controller hub 340 and/or memory devices 120, or can be implemented as a separate sub-circuit. The memory 120 and memory controller 110 can be configured to correct errors in read data as further described herein.

Figure 4:
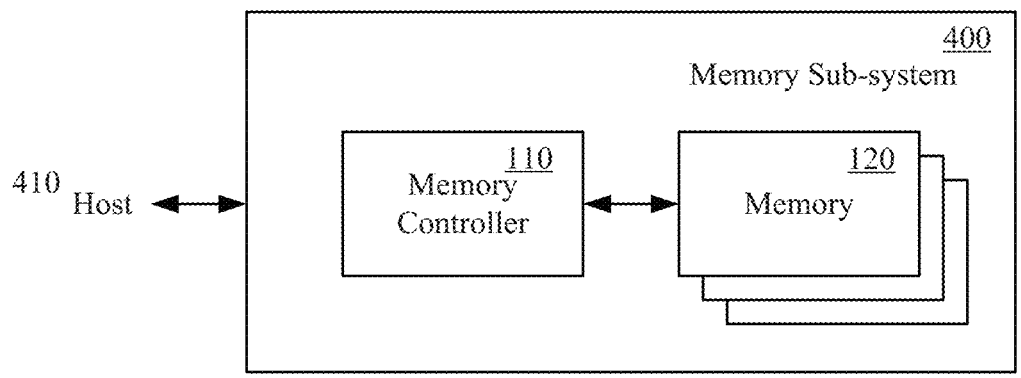
FIG. 4 is a diagram illustrating a memory sub-system in accordance with an example.

FIG. 4 is a diagram illustrating a memory sub-system in accordance with an example. The memory sub-system 400 can include a memory controller 110 and one or more memory devices 120. The memory sub-system 400 can be a memory expansion card, Solid State Drive (SSD), or the like that is configurable to be coupled to a host device 410 such as a smart phone, tablet PC, laptop PC, gaming console, desktop PC or other similar computing device. The memory sub-system 400 can be coupled to the host device as an internal or external peripheral device. The memory 120 and memory controller 110 can be configured to correct errors in read data as further described herein.

Figure 5:
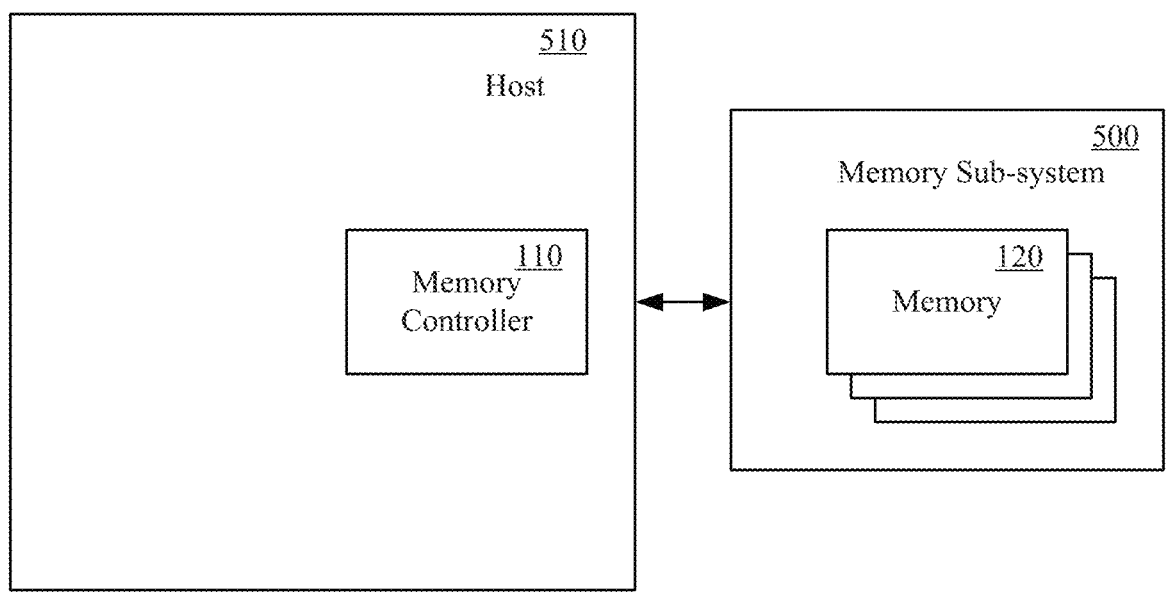
FIG. 5 is a diagram illustrating a memory sub-system in accordance with another example.

FIG. 5 is a diagram illustrating a memory sub-system in accordance with another example. The memory sub-system 500 can include one or more memory devices 120. The memory sub-system 500 can be configurable to be coupled to a memory controller 110 of a host device 510. The host device 510 can be as a smart phone, tablet PC, laptop PC, gaming console, desktop PC or other similar computing device. The memory sub-system 500 can be a memory expansion card, Solid State Drive (SSD), or the like. The memory 120 and memory controller 110 can be configured to correct errors in read data as further described herein.

The computing systems and memory sub-systems of FIGS. 2-5 are illustrative of exemplary embodiments, and are not intended to limit embodiments of the present technology. The device and methods for correcting errors in read data can be readily applied to any number of conventional computing systems and/or memory sub-systems, along with computing systems and/or memory sub-systems to be developed in the future.

Figure 6:
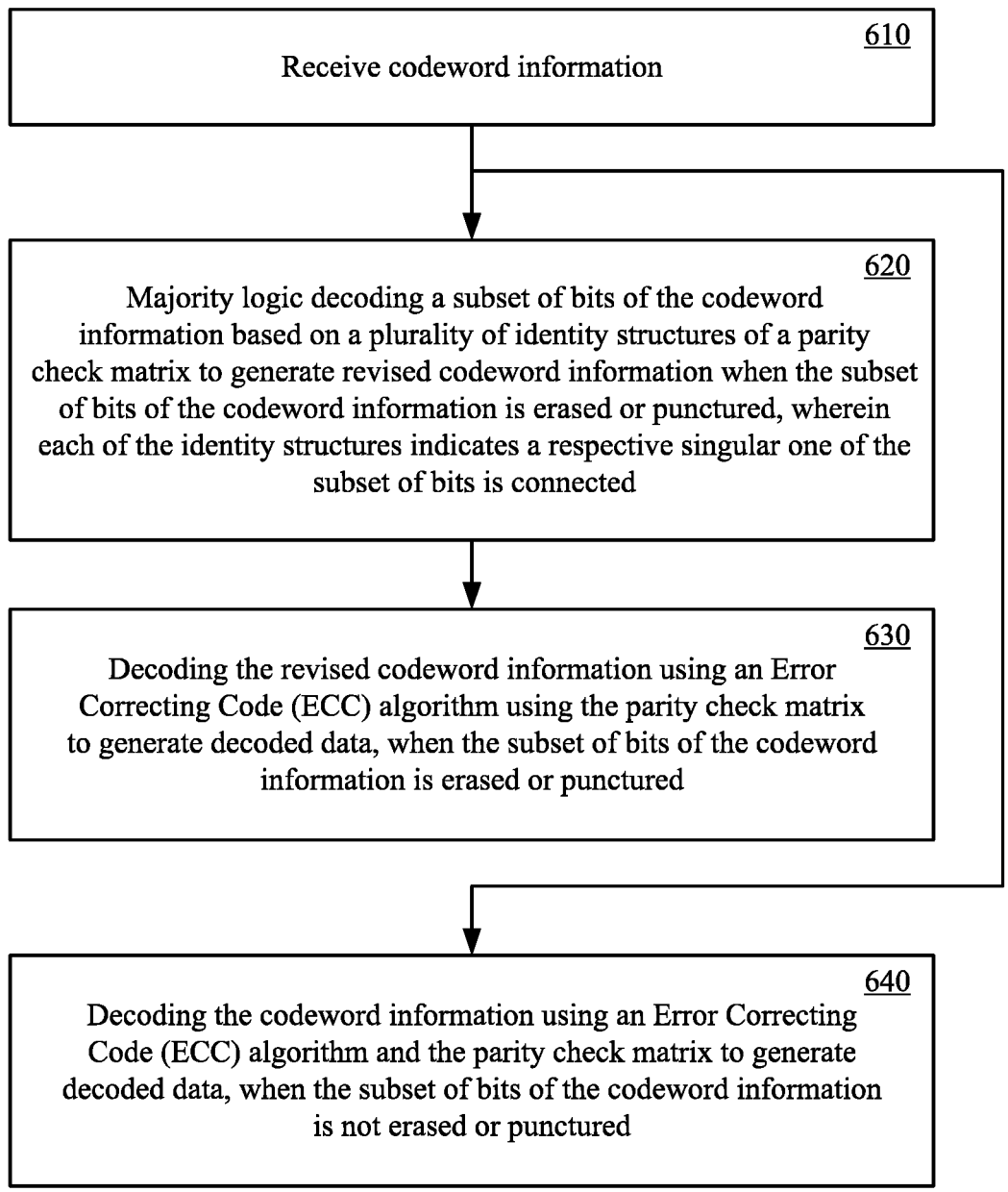
FIG. 6 is a diagram illustrating a method of correcting errors in read data in accordance with an example.

Operation of the memory controller 110 and memory 120 will be further explained with reference to FIGS. 6-11. FIG. 6 is a diagram illustrating a method of correcting errors in read data in accordance with an example. In one aspect, the method includes receiving codeword information 610. The codeword information can be received by the memory controller 110 from one or more memory devices 120. The codeword information can include hard-bit data, or a combination of hard-bit data and soft-bit data.

In one aspect, a subset of bits of the codeword can be majority logic decoded based on a plurality of identity structures in a parity check matrix to generate revised codeword information when the subset of bit of the codeword information is erased or punctured 620. In one instance, information indicating an erasure or puncture can be accessed. The information can be stored in configuration data that the memory controller 110 can access, or can be received from the memory device 120. In one instance, the codeword can include a subset of bits associated with one or more of a plurality of memory cell arrays that failed. In another instance, a subset of bits of the codeword may not have been stored in the one or more memory devices based on support for different sector configurations.

Figures 7, 8:
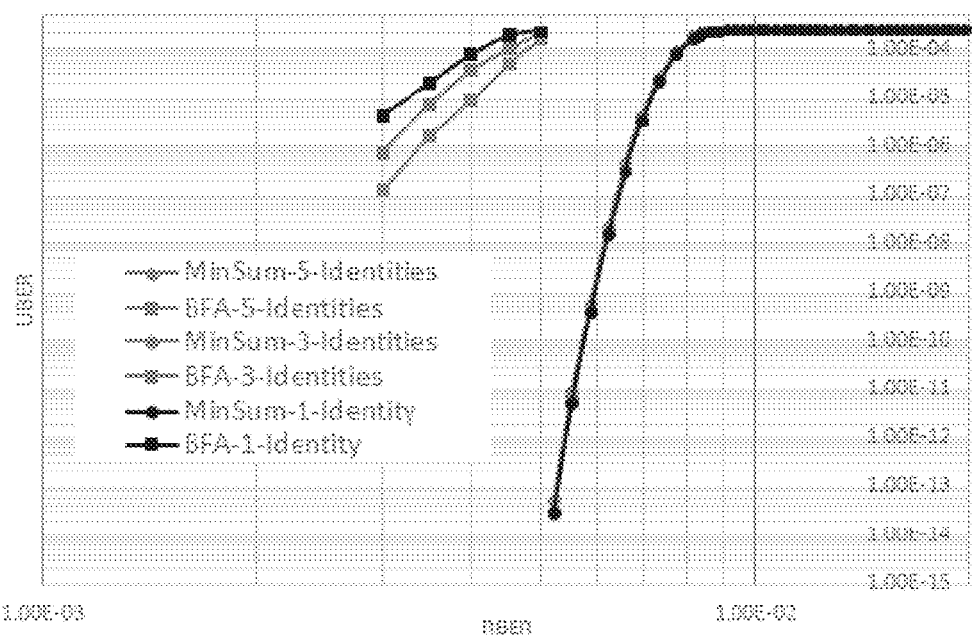
FIG. 7 is a diagram illustrating a parity check matrix, also known as the H-Matrix, in accordance with an example.
FIG. 8 is a diagram illustrating Raw Bit Error Rate (RBER) versus Uncorrectable Bit Error Rate (UBER) for different numbers of identities in accordance with an example.

In one aspect, the parity check matrix is utilized by the majority logic decode algorithm to generate the revised codeword. FIG. 7 is a diagram illustrating a parity check matrix, also known as an H-Matrix, in accordance with an example. The rows of the parity check matrix correspond to parity check equations and the columns correspond to codeword bits. The parity check matrix represents a bipartite graph that includes bit nodes, check nodes, and edge identifiers linking various bit nodes to check nodes. Conventionally, an edge identifier is represented by a value of '1' in the parity check matrix.

For ease of understanding the illustrated parity check matrix corresponds to a codeword with a block length of 10, and 9 parity bit equations. In one instance, codeword bits C8, C9 and C10 may have been erased or punctured. A plurality of identity structures in the parity check matrix can be used to generate revised codeword information. For example, the parity check equations of rows R1, R2 and R3 indicate that:

$$C1 \oplus C7 \oplus C8_p = 0$$

$$C1 \oplus C2 \oplus C9_p = 0$$

$$C1 \oplus C2 \oplus C3 \oplus C10_p = 0$$

where the subscript 'p' denotes the erased or punctured bits and the symbol '$\oplus$' denotes the Boolean Exclusive-OR operator. An estimate of the punctured or erased bits C8, C9 and C10 can be made because the bits C1, C2, C3 and C7 are known operands. A parity check matrix can be selected to include a plurality of identity structures for erased or punctured bits. For example, the parity check matrix can include identity structures in rows R1 and R4 for bit C8, identity structures in rows R2 and R5 for bit C9, and identity structures in rows R3 and R6 for bit C10. Therefore, multiple estimates can be made and a majority logic algorithm can be used to get an overall estimate of the erased or punctured bits. In contrast, the parity check equations in rows R7, R8 and R9 are not identity structures because they include terms for two or more of the erased or punctured bits. For example, parity check equation R7 includes operands for both C8 and C10, which are erased or punctured bits in the example. Similarly, R8 and R9 include operands for C8 and C9, and for C9 and C10, respectively, and therefore are not identity structures.

In one aspect, each identity structure includes a singular one of the subset of bits as an operand. A given parity check equation can be an identity structure connected to a given bit if the only punctured bit in the given parity check equation is the given bit. In other words, each identity structure includes an edge identifier that corresponds to a singular one of the erased or punctured bits, and none of the other erased or punctured bits.

The number of the plurality of identity structures can be based on a column weight of the parity check matrix. In one instance, the column weight of the parity check matrix can be between 3 and 7 for memory devices based on, for example, floating gate transistor type storage cells connected in series with adjacent storage cells sharing source and drain regions. Similarly, the column weight of the parity check matrix can be between 3 and 7 for memory devices based on, for example, Phase Change Memory (PCM) storage cells and a stackable cross-gridded data access array. Generally, the more identity structures that are contained in the parity check matrix, the better the decoding performance. However, there is generally an upper limit to the number of identities that can be included in the parity check matrix. The upper limit can be determined by the maximum column weight allowed and the number of rows in the parity check matrix.

The benefit of having many identity structures in a parity check matrix can be illustrated in the exemplary plot of Raw Bit Error Rate (RBER) versus Uncorrectable Bit Error Rate (UBER) for a 520 Byte (B) codeword configuration shown in FIG. 8. In one instance, a single LDPC can be designed for both 512B and 520B sector configurations. To generate the code-bits for the 512B sector configuration, 64 bits from the overall codeword can be punctured. For the RBER vs. UBER plot there is little difference in performance with either one, three or five identities for use by the Min-Sum algorithm. However, the performance of a Bit-Flipping Decode (BFD) algorithm improves significantly with more identities in the parity check matrix.

Referring again to FIG. 6, the revised codeword information can be decoded using an ECC algorithm and the parity check matrix to generate decoded data when the subset of bits of the codeword information is erased or punctured 630. If the codeword information was not subject to erasure or puncture, the received codeword information can be decoded using the ECC algorithm and the parity check matrix to generate the decoded data 640.

In one aspect, the received or revised codeword information can be decoded using a LDPC algorithm to generate the decoded data. In one implementation, the LDPC algorithm can include a BFD algorithm and a Min-Sum or Sum-Product algorithm, for example. The received or revised codeword information can first be decoded using the BFD algorithm to generate the decoded data. If the BFD algorithm cannot correct one or more errors in the codeword information, the received or revised codeword information can be further decoded using the Min-Sum or Sum-Product algorithm to generate the decoded data.

Figure 9A:
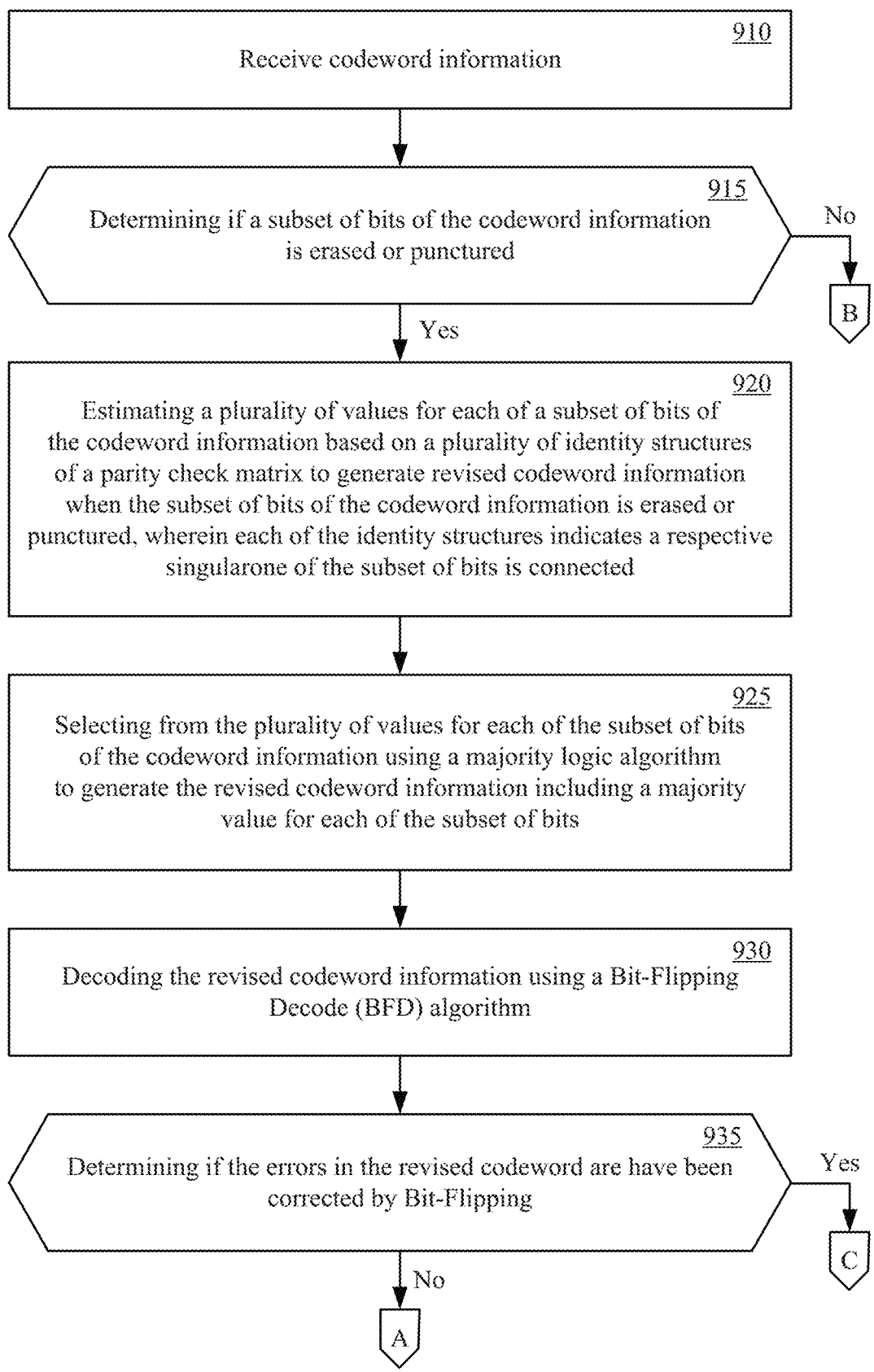
FIGS. 9A-9C is a diagram illustrating a method of correcting errors in read data in accordance with another example.
Figure 9B:
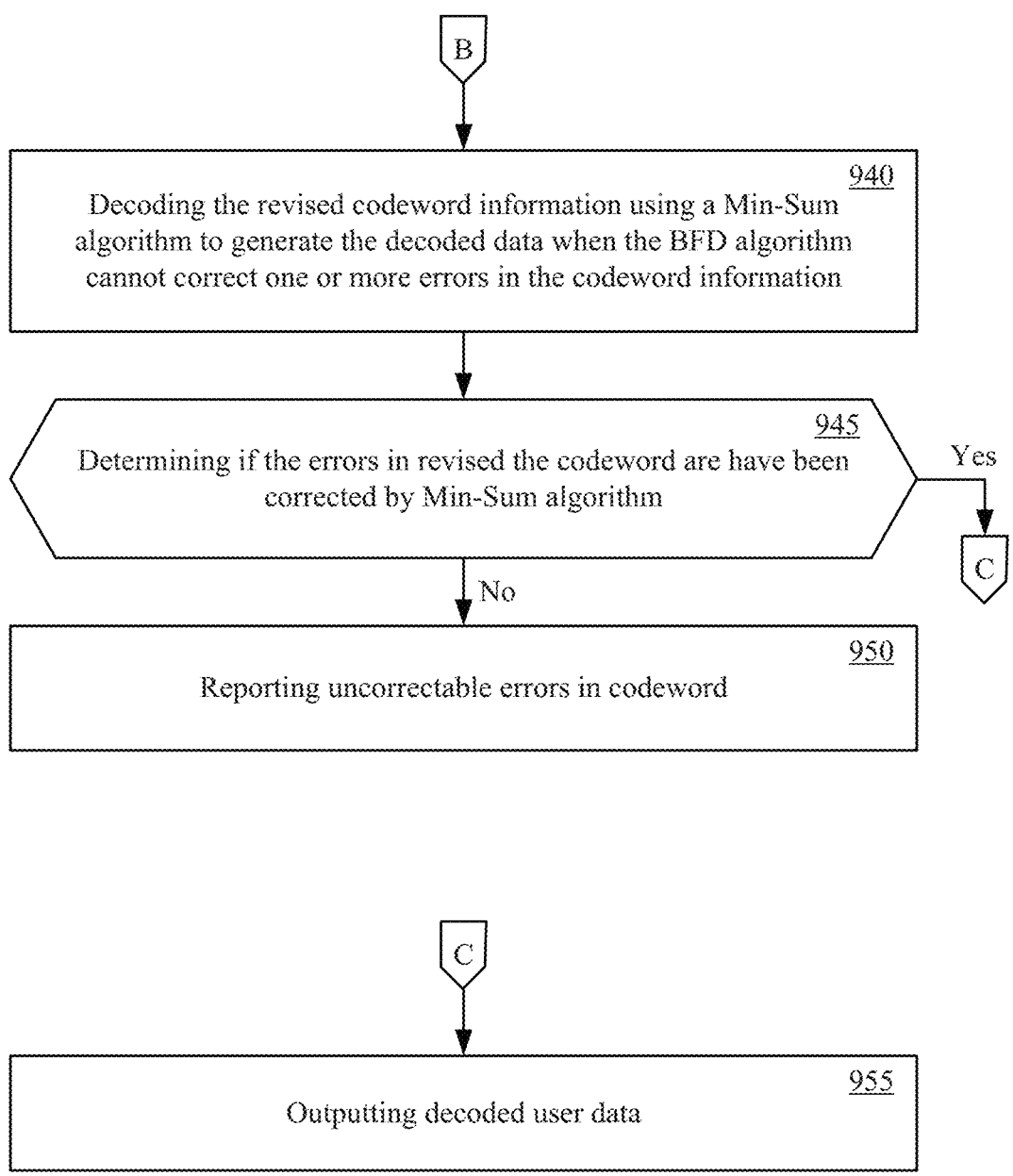
Figure 9C:
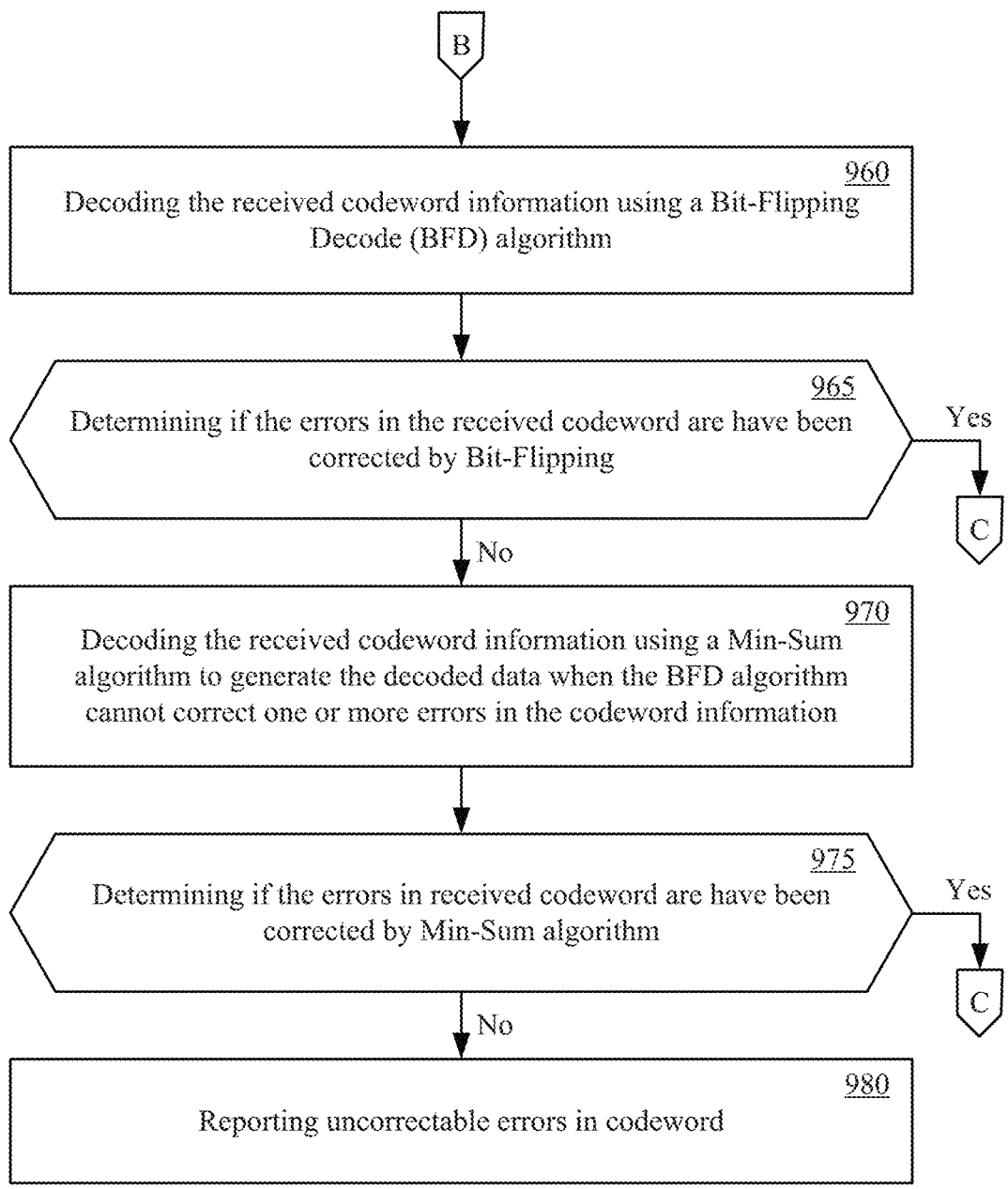

FIGS. 9A-9C is a diagram illustrating a method of correcting errors in read data in accordance with another example. In one aspect, the method includes receiving codeword information 910. The codeword information can be received by the memory controller 110 from one or more memory devices 120. The codeword information can include hard-bit data, or a combination of hard-bit data and soft-bit data.

In one aspect, it is determined if a subset of bits of the codeword information is erased or punctured 915. The memory controller 110 can access information indicating an erasure or puncture to determine whether majority logic decoding of the codeword needs to be performed and which subset of bits in the codeword have been erased or punctured. The information can be stored in configuration data that the memory controller 110 can access, or can be received from the memory device 120. In one instance, the codeword can include a subset of bits associated with one or more of a plurality of memory cell arrays that failed. In another instance, a subset of bits of the codeword may not have been stored in the one or more memory devices based on support for different sector configurations.

In one example, a plurality of values for each of a subset of bits of the codeword information can be estimated based on a plurality of identity structures of a parity check matrix to generate revised codeword information when the subset of bits of the codeword information is erased or puncture 920. In one aspect, each identity structure includes a singular one of the subset of bits as an operand. A given parity check equation can be an identity structure connected to a given bit if the only punctured bit in the given parity check equation is the given bit. In other words, each identity structure includes an edge identifier that corresponds to a singular one of the erased or punctured bits, and none of the other erased or punctured bits.

In one aspect, a majority value can be selected from the plurality of values for each bit in the subset of bits of the codeword information to generate the revised codeword information 925. If for example, there are three identity structures in the parity check matrix associated with a given bit and two of the equations indicate the given bit is a logic '1' and one indicates the given bit is a logic '0,' the majority value of logic '1' can be selected as the value of the given bit in the revised codeword information.

In one aspect, the revised codeword information can be decoded using a BFD algorithm to generate the decoded data 930. In one aspect, it is determined if the errors in the revised codeword have been corrected by the BFD algorithm 935. In one aspect, if the BFD algorithm cannot correct one or more errors in the codeword information, the revised codeword information can be further decoded using the Min-Sum algorithm to generate the decoded data 940. In one aspect, it is determined if the errors in the revised codeword have been corrected by the Min-Sum algorithm 945. If errors remain in the revised codeword after the Min-Sum algorithm, the uncorrectable errors in the codeword can be reported 950. If the errors have been corrected by the BFD algorithm or the Min-Sum algorithm, the decoded user data can be output 955. In one instance, the memory controller 110 can output the user data in response to a memory read request received from a computing device or system.

When the subset of bits of the codeword information is erased or punctured, the received codeword information can be decoded using a BFD algorithm to generate the decoded data 960. In one aspect, it is determined if the errors in the received codeword have been corrected by the BFD algorithm 965. In one aspect, if the BFD algorithm cannot correct one or more errors in the codeword information, the received codeword information can be further decoded using the Min-Sum algorithm to generate the decoded data 970. In one aspect, it is determined if the errors in the received codeword have been corrected by the Min-Sum algorithm 975. If errors remain in the received codeword after the Min-Sum algorithm, the uncorrectable errors in the codeword can be reported 980. If the errors have been corrected by the BFD algorithm or the Min-Sum algorithm, the decoded user data can be output 955.

When a LDPC algorithm is used, the parity check matrix can include a base protograph, having a plurality of identities, in a given one of a plurality of memory cell arrays, and a row permuted protograph of the base protograph in other ones of the plurality of memory cell arrays. In one instance, the codeword can span across 20 dies, for example, and therefore the codewords should be protected from die failures. FIG. 10 is a diagram illustrating a LDPC parity check matrix in accordance with another example. The illustrated LDPC parity check matrix shows the base protograph stored in a first die. The base protograph includes two identities 1010, 1020 to facilitate erased and/or punctured bit majority logic decoding. The protograph structures in the other dies can then be obtained by permuting the rows in the first die so that the row weights for the overall protograph is substantially uniform. Permuting rows in the first die also keeps the identity structure of the subsequent dies so that die fail recovery is possible for any die.

The number of the plurality of identity structures can be based on a column weight of the parity check matrix. In one instance, the column weight of the parity check matrix can be between 3 and 7 for memory devices based on, for example, floating gate transistor type storage cells connected in series with adjacent storage cells sharing source and drain regions. Similarly, the column weight of the parity check matrix can be between 3 and 7 for memory devices based on, for example, Phase Change Memory (PCM) storage cells and a stackable cross-gridded data access array. Generally, the more identity structures that are contained in the parity check matrix the better the decoding performance. However, there is generally an upper limit to the number of identities that can be included in the parity check matrix. The upper limit can be determined by the maximum column weight allowed and the number of rows in the base protograph.

Figure 11:
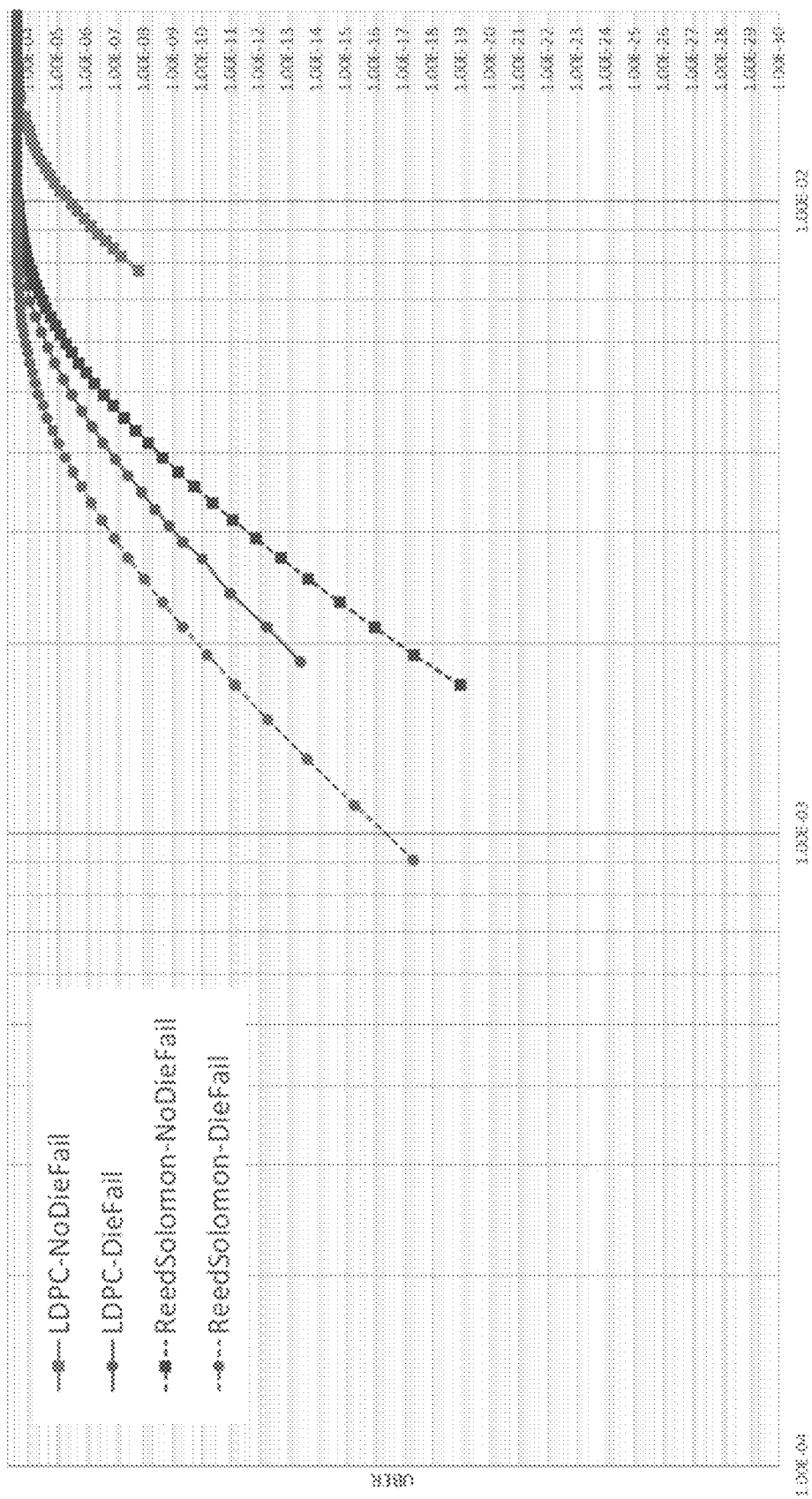
FIG. 11 is a diagram illustrating an improvement with the above LDPC construction in accordance with an example.

FIG. 11 is a diagram illustrating an improvement with the above LDPC construction in accordance with an example. As illustrated, the RBER vs. UBER is graphed for the exemplary LDPC for both cases in which there is no die failure and where there is a die failure. In addition, the RBER vs. UBER for a conventional Reed Solomon decoding scheme is also illustrated for comparison.

In one aspect, the majority logic decode based on a plurality of identify structures of the parity check matrix to estimate a set of erased or punctured bits of a codeword advantageously improves performance of ECC decoding schemes such as LDPC. The erased or punctured bits estimated by the majority logic decode can advantageously improve performance of a BFD, while having substantially no impact performance of a Min-Sum decoding.

EXAMPLES

The following examples pertain to specific technology embodiments and point out specific features, elements, or steps that may be used or otherwise combined in achieving such embodiments.

Example 1 includes a method of correcting errors in read data comprising: receiving codeword information; majority logic decoding a subset of bits of the codeword information based on a plurality of identity structure of a parity check matrix to generate revised codeword information when the subset of bits of the codeword information is erased or punctured, wherein each of the identity structures includes a singular one of the subset of bits as an operand; and decoding the revised codeword information using an Error Correcting Code (ECC) algorithm and the parity check matrix to generate decoded data.

Example 2 includes the method according to Example 1, wherein majority logic decoding the subset of bits of the codeword information includes: estimating a plurality of values for each of a subset of bits of the codeword information based on the plurality of identity structures; and selecting from the plurality of values for each of the subset of bits of the codeword information using a majority logic algorithm to generate the revised codeword information including a majority value for each of the subset of bits.

Example 3 includes the method according to Examples 1 or 2, wherein the subset of bits of the codeword were associated with one or more of a plurality of memory cell arrays that failed.

Example 4 includes the method according to Examples 1 or 2, wherein the subset of bits of the codeword were not stored in a memory.

Example 5 includes the method according to Examples 1 or 2, wherein the number of the plurality of identity structures is based on a column weight of the parity check matrix.

Example 6 includes the method according to Example 5, wherein the column weight of the parity check matrix is between 3 and 7.

Example 7 includes the method according to Examples 1 or 2, wherein decoding the revised codeword information using the Error Correcting Code (ECC) algorithm includes decoding the revised codeword information using a Low-Density Parity Code (LDPC) algorithm to generate the decoded data.

Example 8 includes the method according to Example 7, wherein decoding the revised codeword information using the LDPC algorithm includes: decoding the revised codeword information using a Bit-Flipping Decode (BFD) algorithm to generate the decoded data; and decoding the revised codeword information using a Min-Sum algorithm to generate the decoded data when the BFD algorithm cannot correct one or more errors in the codeword information.

Example 9 includes the method according to Example 7, wherein the parity check matrix includes: a base protograph, having a plurality of identities, in a given one of a plurality of memory cell arrays; and a row permuted protograph of the base protograph in other ones of the plurality of memory cell arrays.

Example 10 includes the method according to Examples 1 or 2, further comprising accessing information indicating an erasure or puncture of the subset of bits of the codeword information.

Example 11 includes the method according to Examples 1 or 2, wherein each of the identity structures includes an edge identifier that corresponds to a singular one of the subset of bits and none of the other ones of the subset of bits.

Example 12 includes a memory system configured to correct read data errors comprising: a memory device; and a memory controller configured to, receive codeword information; majority logic decode a subset of bits of the codeword information based on a plurality of identity structure of a parity check matrix to generate revised codeword information when the subset of bits of the codeword information is erased or punctured, wherein each of the identity structures includes a singular one of the subset of bits as an operand; and decoding the revised codeword information using an Error Correcting Code (ECC) algorithm using the parity check matrix to generate decoded data.

Example 13 includes the memory system according to Example 12, wherein the memory controller configured to majority logic decode the subset of bits of the codeword information includes the memory controller further configured to: estimate a plurality of values for each of a subset of bits of the codeword information based on the plurality of identity structures; and select from the plurality of values for each of the subset of bits of the codeword information using a majority logic algorithm to generate the revised codeword information including a majority value for each of the subset of bits.

Example 14 includes the memory system according to Examples 12 or 13, further comprising accessing information indicating an erasure or puncture of the subset of bits of the codeword information.

Example 15 includes the memory system according to Example 12, wherein the memory device includes a plurality of memory cell arrays.

Example 16 includes the memory system according to Examples 12 or 15, wherein the column weight of the parity-check matrix is between 3 and 7.

Example 17 includes the memory system according to Examples 12 or 14, wherein the memory device includes a plurality of arrays of Phase Change Memory (PCM) storage cells and a stackable cross-gridded data access array.

Example 18 includes the memory system according to Example 15, wherein the subset of bits of the codeword are associated with one or more of the plurality of memory cell arrays that failed.

Example 19 includes the memory system according to Example 12, wherein the codeword comprises a variable rate codeword.

Example 20 includes the memory system according to Example 12, wherein a number of the identity structures of the parity check matrix is a function of a predetermined column weight of the parity check matrix and a number of rows in the parity check matrix.

Example 21 includes the memory system according to Examples 12 or 19, wherein the memory device comprises a one or more arrays of floating gate transistor storage cells connected in series with adjacent storage cells sharing source and drain regions.

Example 22 includes the memory system according to Example 19, wherein the subset of bits of the codeword were not stored in the memory.

Example 23 includes the memory system according to Example 12, wherein the number of the plurality of identity structures is based on a column weight of the parity check matrix.

Example 24 includes the memory system according to Example 12, wherein the ECC decoder configured to decode the revised codeword information using an ECC algorithm includes the ECC decoder further configured to decode the revised codeword information using a Low-Density Parity Code (LDPC) algorithm to generate decoded data.

Example 25 includes the memory system according to Example 24, wherein the ECC decoder configured to decode the revised codeword information using the LDPC algorithm includes the ECC decoder further configured to: decode the revised codeword information using a Bit-Flipping Decode (BFD) algorithm to generate the decoded data; and decode the revised codeword information using a Min-Sum algorithm to generate the decoded data when the BFD algorithm cannot correct one or more errors in the codeword information.

Example 26 includes the memory system according to Example 24, wherein the parity check matrix includes: a base protograph, having a plurality of identities, in a given one of a plurality of memory cell arrays; and a row permuted protograph of the base protograph in other ones of the plurality of memory cell arrays.

Example 27 includes the memory system according to Example 12, wherein each of the identity structures includes an edge identifier that corresponds to a singular one of the subset of bits and none of the other ones of the subset of bits.

Example 28 includes a system including read data error detection and correction comprising: an input/output (I/O) subsystem; a processing unit; a memory subsystem including, a memory device; a memory controller configured to, estimate a plurality of values for each of a subset of bits of the codeword information based on a plurality of identity structures of a parity check matrix when the subset of bits of the codeword information is erased or punctured, wherein each of the identity structures includes a singular one of the subset of bits as an operand; select from the plurality of values for each of the subset of bits of the codeword information using a majority logic algorithm to generate a revised codeword information including a majority value for each of the subset of bits when the subset of bits of the codeword information is erased or punctured; and decoding the revised codeword information using an Error Correcting Code (ECC) algorithm and parity check matrix.

Example 29 includes the system according to Example 28, wherein the memory device includes a plurality of memory cell arrays.

Example 30 includes the system according to Examples 28 or 29, wherein the column weight of the parity-check matrix is between 3 and 7.

Example 31 includes the system according to Examples 28 or 29, wherein the memory device includes a plurality of arrays of Phase Change Memory (PCM) storage cells and a stackable cross-gridded data access array.

Example 32 includes the system according to Example 29, wherein the subset of bits of the codeword are associated with one or more of the plurality of memory cell arrays that failed.

Example 33 includes the system according to Example 28, wherein the codeword comprises a variable rate codeword.

Example 34 includes the system according to Example 28, wherein a number of the identity structures of the parity check matrix is a function of a predetermined column weight of the parity check matrix and a number of rows in the parity check matrix.

Example 35 includes the system according to Examples 28 or 33, wherein the memory device comprises a one or more arrays of floating gate transistor storage cells connected in series with adjacent storage cells sharing source and drain regions.

Example 36 includes the system according to Example 33, wherein the subset of bits of the codeword were not stored in the memory.

Example 37 includes the system according to Example 28, wherein the number of the plurality of identity structures is based on a column weight of the parity check matrix.

Example 38 includes the system according to Example 28, wherein the ECC decoder configured to decode the revised codeword information using an ECC algorithm includes the ECC decoder further configured to decode the revised codeword information using a Low-Density Parity Code (LDPC) algorithm to generate decoded data.

Example 39 includes the system according to Examples 38, wherein the ECC decoder configured to decode the revised codeword information using the LDPC algorithm includes the ECC decoder further configured to: decode the revised codeword information using a Bit-Flipping Decode (BFD) algorithm to generate the decoded data; and decode the revised codeword information using a Min-Sum algorithm to generate the decoded data when the BFD algorithm cannot correct one or more errors in the codeword information.

Example 40 includes the system according to Example 38, wherein the parity check matrix includes: a base protograph, having a plurality of identities, in a given one of a plurality of memory cell arrays; and a row permuted protograph of the base protograph in other ones of the plurality of memory cell arrays.

Example 41 includes the system according to Example 28, wherein the memory controller is further configured to access information indicating an erasure or puncture of the subset of bits of the codeword information.

Example 42 includes the system according to Example 28, wherein each of the identity structures includes an edge identifier that corresponds to a singular one of the subset of bits and none of the other ones of the subset of bits.

While the forgoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts of the technology.

What is claimed is:

1. A memory system configured to correct read data errors comprising:
    a memory device; and
    a memory controller configured to;
        receive codeword information;
        majority logic decode a subset of bits of the codeword information based on a plurality of identity structures of a parity check matrix to generate revised codeword information when the subset of bits of the codeword information is erased or punctured, wherein each of the identity structures includes a singular one of the subset of bits as an operand; and
        decode the revised codeword information using an Error Correcting Code (ECC) algorithm using the parity check matrix to generate decoded data.

2. The memory system according to claim 1, wherein, to majority logic decode the subset of bits of the codeword information, the memory controller is further configured to:
    estimate a plurality of values for each of a subset of bits of the codeword information based on the plurality of identity structures; and
    select from the plurality of values for each of the subset of bits of the codeword information using a majority logic algorithm to generate the revised codeword information including a majority value for each of the subset of bits.

3. The memory system according to claim 1, wherein the memory device includes a plurality of memory cell arrays.

4. The memory system according to claim 3, wherein the subset of bits of the codeword information are associated with one or more of the plurality of memory cell arrays that failed.

5. The memory system according to claim 1, wherein the memory device includes a plurality of arrays of Phase Change Memory (PCM) storage cells and a stackable cross-gridded data access array.

6. The memory system according to claim 1, wherein a number of the identity structures of the parity check matrix is a function of a predetermined column weight of the parity check matrix and a number of rows in the parity check matrix.

7. The memory system according to claim 1, wherein the memory device comprises a one or more arrays of floating gate transistor storage cells connected in series with adjacent storage cells sharing source and drain regions.

8. The memory system according to claim 1, wherein the subset of bits of the codeword information is not stored in the memory device.

9. The memory system according to claim 1, wherein a number of the plurality of identity structures is based on a column weight of the parity check matrix.

10. The memory system according to claim 1, wherein to decode the revised codeword information using the ECC algorithm includes to decode the revised codeword information using a Low-Density Parity Code (LDPC) algorithm to generate decoded data.

11. The memory system according to claim 10, wherein to decode the revised codeword information using the LDPC algorithm includes to:
  decode the revised codeword information using a Bit-Flipping Decode (BFD) algorithm to generate the decoded data; and
  decode the revised codeword information using a Min-Sum algorithm to generate the decoded data when the BFD algorithm cannot correct one or more errors in the codeword information.

12. The memory system according to claim 10, wherein the parity check matrix includes:
  a base protograph, having a plurality of identities, in a given one of a plurality of memory cell arrays; and
  a row permuted protograph of the base protograph in other ones of the plurality of memory cell arrays.

13. The memory system according to claim 12, wherein each of the identity structures includes an edge identifier that corresponds to a singular one of the subset of bits and none of the other ones of the subset of bits.

14. A method of correcting errors in read data comprising:
  receiving codeword information;
  majority logic decoding a subset of bits of the codeword information based on a plurality of identity structures of a parity check matrix to generate revised codeword information when the subset of bits of the codeword information is erased or punctured, wherein each of the identity structures includes a singular one of the subset of bits as an operand; and
  decoding the revised codeword information using an Error Correcting Code (ECC) algorithm and the parity check matrix to generate decoded data.

15. The method according to claim 14, wherein majority logic decoding the subset of bits of the codeword information includes:
  estimating a plurality of values for each of a subset of bits of the codeword information based on the plurality of identity structures; and
  selecting from the plurality of values for each of the subset of bits of the codeword information using a majority logic algorithm to generate the revised codeword information including a majority value for each of the subset of bits.

16. The method according to claim 14, wherein the subset of bits of the codeword information were associated with one or more of a plurality of memory cell arrays that failed.

17. The method according to claim 14, wherein the subset of bits of the codeword information were not stored in a memory.

18. The method according to claim 14, wherein a number of the plurality of identity structures is based on a column weight of the parity check matrix.

19. The method according to claim 18, wherein the column weight of the parity check matrix is between 3 and 7.

20. The method according to claim 14, wherein decoding the revised codeword information using the Error Correcting Code (ECC) algorithm includes decoding the revised codeword information using a Low-Density Parity Code (LDPC) algorithm to generate the decoded data.

21. The method according to claim 20, wherein decoding the revised codeword information using the LDPC algorithm includes:
  decoding the revised codeword information using a Bit-Flipping Decode (BFD) algorithm to generate the decoded data; and
  decoding the revised codeword information using a Min-Sum algorithm to generate the decoded data when the BFD algorithm cannot correct one or more errors in the codeword information.

22. The method according to claim 20, wherein the parity check matrix includes:
  a base protograph, having a plurality of identities, in a given one of a plurality of memory cell arrays; and
  a row permuted protograph of the base protograph in other ones of the plurality of memory cell arrays.

23. The method according to claim 14, further comprising accessing information indicating an erasure or puncture of the subset of bits of the codeword information.

24. The method according to claim 14, wherein each of the identity structures includes an edge identifier that corresponds to a singular one of the subset of bits and none of the other ones of the subset of bits.

25. A system including read data error detection and correction comprising:
  an input/output (I/O) subsystem;
  a processing unit;
  a memory subsystem including,
    a memory device;
    a memory controller configured to;
      estimate a plurality of values for each of a subset of bits of codeword information based on a plurality of identity structures of a parity check matrix when the subset of bits of the codeword information is erased or punctured, wherein each of the identity structures includes a singular one of the subset of bits as an operand;
      select from the plurality of values for each of the subset of bits of the codeword information using a majority logic algorithm to generate a revised codeword information including a majority value for each of the subset of bits when the subset of bits of the codeword information is erased or punctured; and
      decoding the revised codeword information using an Error Correcting Code (ECC) algorithm and parity check matrix.

26. The system according to claim 25, wherein a number of the identity structures of the parity check matrix is a function of a predetermined column weight of the parity check matrix and a number of rows in the parity check matrix.

27. The system according to claim 25, wherein to decode the revised codeword information using the ECC algorithm includes to decode the revised codeword information using a Low-Density Parity Code (LDPC) algorithm to generate decoded data.

28. The according to claim 27, wherein to decode the revised codeword information using the LDPC algorithm includes to:
   decode the revised codeword information using a Bit-Flipping Decode (BFD) algorithm to generate the decoded data; and
   decode the revised codeword information using a Min-Sum algorithm to generate the decoded data when the BFD algorithm cannot correct one or more errors in the codeword information.

29. The system according to claim 27, wherein the parity check matrix includes:
   a base protograph, having a plurality of identities, in a given one of a plurality of memory cell arrays; and
   a row permuted protograph of the base protograph in other ones of the plurality of memory cell arrays.

30. The system according to claim 25, wherein each of the identity structures includes an edge identifier that corresponds to a singular one of the subset of bits and none of the other ones of the subset of bits.

* * * * *